United States Patent [19]
Krohn et al.

[11] Patent Number: 4,769,817
[45] Date of Patent: Sep. 6, 1988

[54] CONCURRENT FAULT SIMULATION FOR LOGIC DESIGNS

[75] Inventors: Howard E. Krohn, Shoreview; James L. Jasmin, White Bear Lake, both of Minn.

[73] Assignee: Zycad Corporation, St. Paul, Minn.

[21] Appl. No.: 824,541

[22] Filed: Jan. 31, 1986

[51] Int. Cl.$^4$ .................. G01R 31/28; G06F 11/00
[52] U.S. Cl. ............................................. 371/23
[58] Field of Search .............. 371/23, 15; 324/73 R, 324/73 AT

[56] References Cited

U.S. PATENT DOCUMENTS

| | | | |
|---|---|---|---|
| 3,715,573 | 2/1973 | Vogelsberg | 371/23 |
| 3,775,598 | 11/1973 | Chao et al. | 371/23 |
| 4,228,537 | 10/1980 | Henckels et al. | 371/23 |
| 4,527,249 | 7/1985 | Van Brunt | 364/578 |
| 4,587,625 | 5/1986 | Marino, Jr. et al. | 364/578 |
| 4,601,032 | 7/1986 | Robinson | 371/23 |

OTHER PUBLICATIONS

"The Concurrent Simulation of Nearly Identical Digital Networks," by E. Ulrich and T. Baker, GTE Laboratories, Inc., Waltham. MA 02154.
"High-Speed Concurrent Fault Simulation With Vectors and Scalars," by E. Rlfich, D. Lacy, N. Phillips, J. Tellier, et al., Digital Equipment Corp.
"An Accurate Functional Level Concurrent Fault Simulator", by M. d'Abreu, Honeywell Information Systems, and E. Thompson, University of Texas.

Primary Examiner—Charles E. Atkinson
Attorney, Agent, or Firm—Merchant, Gould, Smith, Edell, Welter & Schmidt

[57] ABSTRACT

A system for concurrent evaluation of the effect of multiple faults in a logic design being evaluated is particularly useful in the design of very large scale integrated circuits for developing a compact input test set which will permit locating a predetermined percentage of all theoretically possible fault conditions in the manufactured chips. The system includes logic evaluation hardware for simulating a given logic design and evaluating the complete operation thereof prior to committing the design to chip fabrication. In addition, and concurrently with the logic design evaluation, the system includes means for storing large number of predetermined fault conditions for each gate in the design, and for evaluating the "fault operation" for each fault condition for each gate, and comparing the corresponding results against the "good machine" operation, and storing the fault operation if different from the good operation. By repeating the process on an event-driven basis from gate to subsequently affected gates throughout the design, a file of all fault effects can be developed from which an input test set for the logic design can be developed based on considerations of the required percentage of all possible faults to be detected and the time that can be allowed for testing of each chip. Special hardware is provided for identifying and eliminating hyperactive or oscillating faults to maintain processing efficiency.

13 Claims, 13 Drawing Sheets

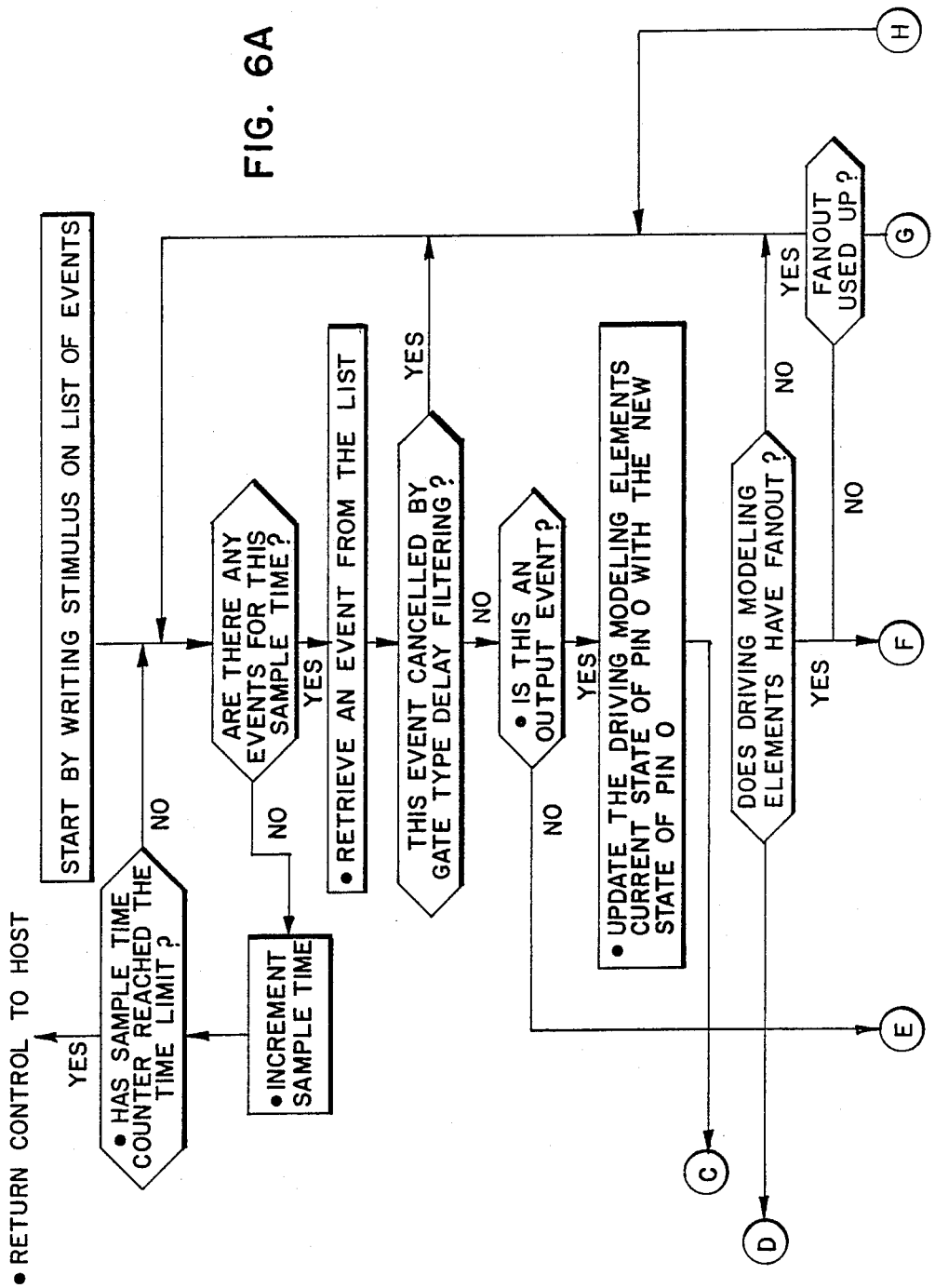

CONCURRENT FAULT SIMULATION FOR LOGIC DESIGNS

FIELD OF THE INVENTION

This invention pertains to the field of designing and perfecting electronic logic networks and specifically to apparatus and techniques for testing and discovering faults which might occur in the manufacture of large or very large scale integrated logic circuits, through the use of test sequences.

BACKGROUND OF THE INVENTION

Continuing advances in the semiconductor industry have made possible the production of integrated circuits with increasingly larger numbers of logic or other elements on a single chip. The increasing complexity of LSI or VLSI chips made possible by these advances and the high costs involved in initial production of a chip from a logic design have made logic simulation an important step in the chip design process. Logic simulation techniques are available in the art for simulating operation of a logic design for a chip prior to the start of fabrication of the chip, to uncover any operational errors therein, and to permit redesign as necessary before committing the design to chip fabrication. Various logic simulation computer programs are known in the art for performing this function. In adition, hardware logic simulator networks in accordance with U.S. Pat. No. 4,527,249, now assigned to the assignee of this application, provide highly efficient techniques for simulating and testing logic device designs.

A different but somewhat related problem existing in the semiconductor industry is in the testing of manufactured chips. Even assuming a good, error-free logic design, it is well known that various faults and errors can enter into the production process which can result in functional defects in a manufactured chip. These faults can enter through a variety of causes in the numerous manufacturing process steps, and can affect any of the different gates, switches or lines on the chip. Although the causes of such errors are diverse, as a practical matter for testing purposes, they can be considered to occur on essentially a random basis anywhere in a chip.

This presents a problem for production testing, since for complex chips such as microprocessors or other VLSI circuits there are so many circuit elements and combinations of inputs and outputs that it becomes totally impractical to test all possible input combinations against the known design standard. With such complex chips it might take half an hour or even longer to run through all input combination sets, and of course a chip production rate of two per hour is not financially feasible on a commercial basis. Consequently, it has become standard practice to use a reduced or limited set of input states, or input vectors, carefully chosen with the intent of catching a predetermined percentage of all possible faults, for example 95%, which is common in commercial practice, or perhaps 98%, which is specified in some military applications. This typically gives the possibility of testing with perhaps only 100,000 or 500,000 input sets instead of many millions, and the reduced number of sets can be run through in a matter of seconds. If the input set is well chosen, this provides a workable and commercially acceptable production testing capability. However, the key questions remaining are how to select a reasonably compact set of inputs to test for a given percentage of all possible faults, and how to prove that a particular input test set will in fact test for the required percentage of faults.

One current technique for developing a test set of inputs is through a technique known as serial fault simulation. In this technique a logic simulation is first run on a correct network to determine the correct output "signature", then is run repeatedly with a given specific error being introduced on each pass. For example, a particular input for a particular gate is "stuck" to a logical one or logical zero, then some input sets and corresponding outputs are run on the design and checked to see whether that particular fault shows up as a change in the output signature for a given set of inputs. The process is then repeated for another "stuck" gate, and so on, until a set of data is built up that will detect a predetermined percentage of all such faults. The set can be compacted by eliminating redundancies, since a given input set may detect a number of different fault conditions. This serial technique, and several variants which are in use, take many runs through the logic design by the logic simulator, and are therefore very time-consuming.

SUMMARY OF THE INVENTION

In order to overcome these and other limitations of the prior art, the present invention provides a hardware network or system which provides concurrent multiple fault simulation along with logic simulation for a logic design being tested at a very high rate of speed which may be from one to several orders of magnitude faster than the serial approach of the prior art.

The concurrent fault simulator according to the present invention performs multiple fault simulation concurrently with logic simulation for the design being evaluated. The logic simulator and fault simulator are event-driven so that only those gates affected by an event being simulated at a particular gate need be evaluated as subsequent events. For each event at each gate, while a logic simulation takes place for a "good" logic network to determine outputs which result from given inputs for that gate, simultaneously the fault simulator simulates the overlapping "faulty" logic networks caused by a number of predetermined faults, i.e., particular logic gates whose inputs or outputs may be stuck at one or zero. The fault simulator simulates the differences that an event causes on a particular gate's inputs or outputs by the presence of faults and records these differences in a fault list for the particular gate. The fault simulator hardware also generates and simulates additional events related only to the faults, even if delayed in time, which are distinctly separate from events in the "good" logic network.

Processing through a design proceeds gate by gate in event-driven fashion, with the result that records of gate inputs and outputs for fault conditions are generated. An input test set can be developed from these records of fault conditions having the capability for testing for a desired percentage of all possible faults. This is possible because the fault records contain all fault situations which produce outputs different from what the good logic network would do under the same circumstances.

A great savings of time is achieved since subsequent serial passes are not needed for each new fault. Instead, simulation for a large number of faults per logic network (which number can be large enough to cover all faults for most gates) proceeds simultaneously with logic evaluation of a good network, so that only a moderate amount of additional processing time is required.

SUMMARY OF THE INVENTION

According to the present invention there is provided logic fault simulation apparatus which includes, or operates in conjunction with, logic simulation apparatus, for evaluating predetermined fault conditions for a logic network concurrently with simulation of the "good" operation of the logic network design.

The logic evaluation apparatus which is included in, or with which the fault simulation apparatus works, generally includes memory means for receiving and holding information from a host processor describing the logic design under test, including the logic functions of all gates or elements, all gate interconnections and design functions; further memory means for holding the present state of each element or gate; means for proceeding on a time-slice basis to simulate gate operation to determine if a function generated causes any change of state to any element or gate, and if so, to update its present state. The process is repeated in functional order from input to output of the logic design being verified.

The fault simulation apparatus additionally includes means for holding a list of specific faults to be evaluated which are associated with individual gates or elements of the design; means responsive to the fault list and to the gate being evaluated to simulate the fault operation for each fault corresponding to a gate concurrently with the simulation of the good operation of the gate; and means for comparing the fault operations and good operation of each gate and for storing data representing the fault operation only if it differs from the good operation.

BRIEF DESCRIPTION OF THE DRAWING

In the drawing,

FIGS. 6A, 6B and 6C are a flowchart illustrating the operation of the present invention.

DETAILED DESCRIPTION OF THE PREFERRED EMBODIMENT

Figure 1:
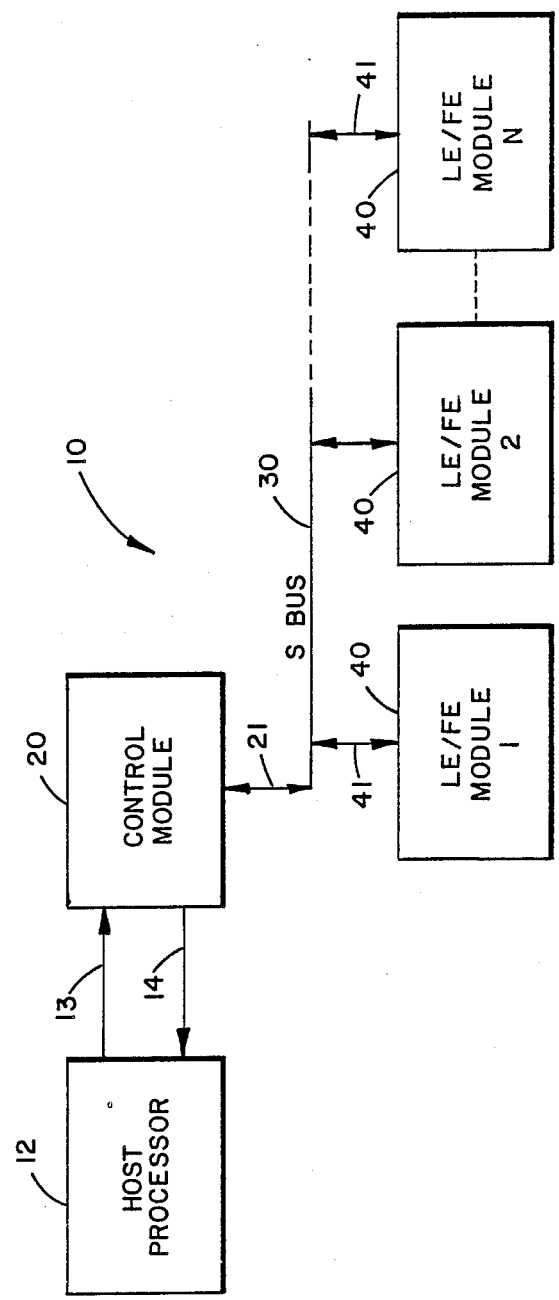
FIG. 1 is a generalized block diagram of a fault simulator system according to the present invention.

FIG. 1 generally shows the overall configuration of a fault simulator system 10 according to the present invention, and its relationship to a host processor 12. Host processor 12 is used for assembling and organizing the data describing the logic network design to be evaluated, in terms of types and operation of gates or other elements, interconnections, and design features, and also for assembling information for all faults to be injected and simulated. Once this data is passed to control module 20 over data path 13, the simulation process then proceeds under control of module 20. At the end of a simulation process, relevant data concerning logic and fault simulation developed during the process is passed back to host processor 12 over data path 14, where it can be analyzed and reviewed or, if necessary, modified for further processing runs.

A control module 20 is provided, which may be generally the same as the control module shown in the previously mentioned U.S. Pat. No. 4,527,249. Control module 20 communicates via data path 21 to a data bus 30 which is referred to as the simulation bus or S-bus. This bus in turn communicates to a number of logic evaluation/fault evaluation modules 40, which communicate therewith over data paths 41. A number of modules 40 can be provided, and in the preferred embodiment, from one to four of such modules may be used, depending upon the complexity of evaluation and speed of processing required. In other embodiments, a greater number than four could be used.

In operation, control module 20 sends event-driven/sample-time simulation data on the simulation bus 30 to modules 40, and issues commands to initiate simulation in modules 40.

The logic evaluation/fault evaluation modules 40 perform multiple functions. They evaluate the logic of the design being tested to produce the simulation result, as is known in the art, for example generally as set forth in the previously mentioned U.S. Pat. No. 4,527,249. In addition, modules 40 perform concurrent fault simulation according to the present invention. They contain additional logic and memory over that required for logic simulation, to store fault numbers corresponding to specific fault conditions being simulated, for storing fault states which correspond to the specific fault numbers, and for storing time and schedulage information pertaining to faults at a gate which operates through a delay to create a fault input at other gates at a subsequent event sample time. Further memory and memory addressing logic are also provided for comparing a fault simulation to the logic simulation for a good logic network for a given gate and fault number, and for updating and storing records of fault differences from the logic network simulation.

Figure 2A:
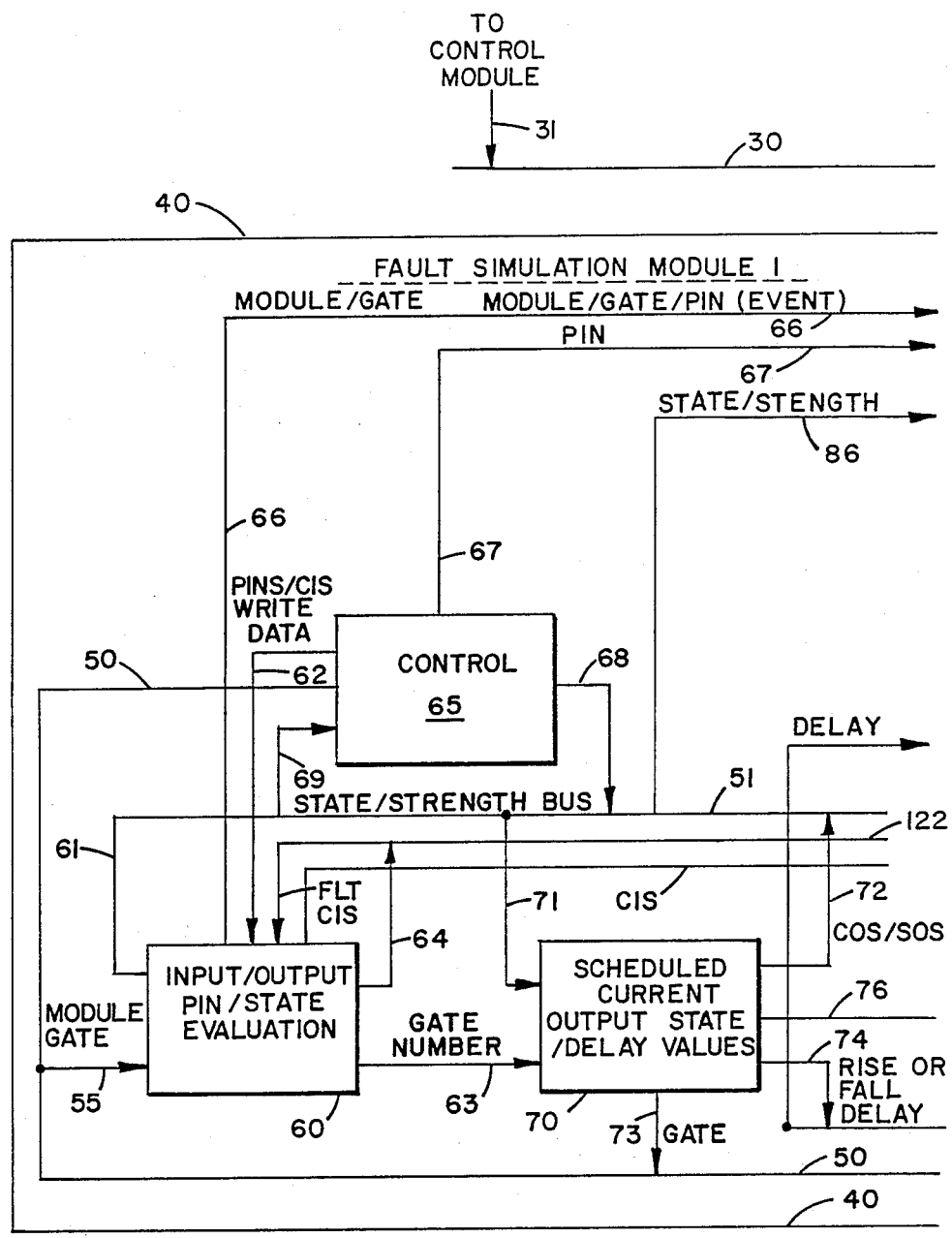
FIGS. 2A and 2B are a functional block diagram of one of the logic simulation/fault simulation modules of the system of FIG. 1.
Figure 2B:
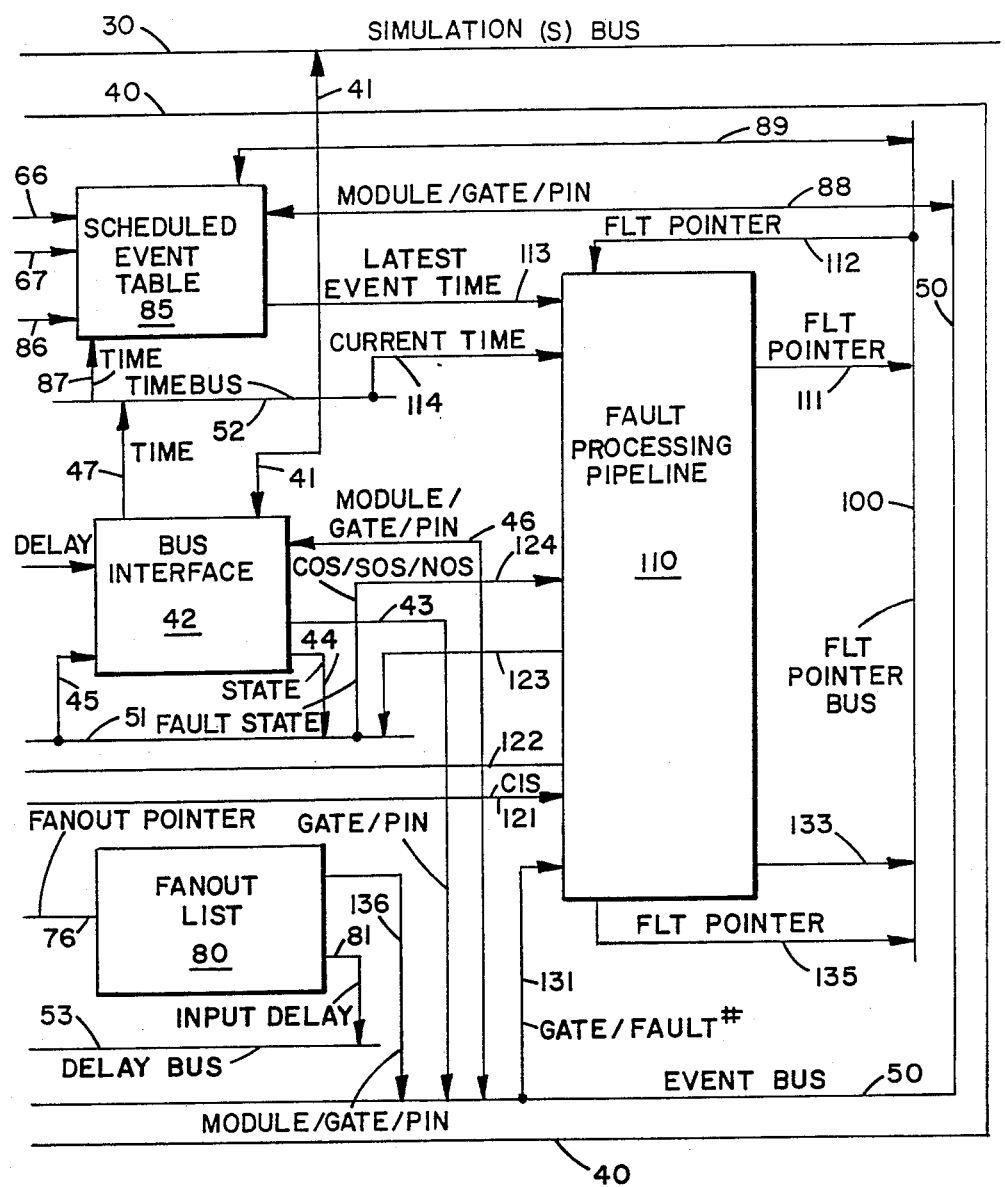

Referring now to FIGS. 2A and 2B, a logic evaluation and fault evaluation module 40 is shown in greater detail. Data path 41 connects from the simulation S-bus 30 to a bus interface 42. Bus interface 42 provides an output on data path 43 to deliver gate and pin information to event bus 50, for distribution to other blocks as discussed in greater detail below. Bus interface 42 also provides an output on data path 44 which provides state information to the state/strength bus 51. Data path 45 connects from bus 51 back to bus interface 42 for transmission to the S-bus. Data path 46 conveys module, gate and pin information from event bus 50 back to interface 42 for transmission back to the S-bus. Interface 42 also connects via data path 47 to a time bus 52.

Event bus 50 is connected by data path 55 to provide module and gate information to input pin/output state evaluation block 60. Functional block 60 also receives an input on data path 61 from state/strength bus 51, and an input on data path 62 from control 65, which provides pin and current input state write data. The pin/state update block 60 provides an output on data path 63 to provide gate number information to the scheduled current output/delay block 70. Block 60 also provides an output on path 64 to the state/strength bus 51, and an output on path 66 which provides module and gate number information to the scheduled event table 85. Control 65 also provides pin number information on data path 67 to scheduled event table 85. Control 65 also communicates with state/strength bus 51 on data paths 68 and 69.

The scheduled, current output/delay block 70 receives data from state/strength bus 52 over data path 71, and communicates therewith to povide current output state and scheduled output state information via data path 72. It also provides gate number output data on data path 73 to event bus 70, and rise or fall delay data on data path 74 which connects to delay bus 53. In addition, block 70 provides fanout pointer information on data path 76 to fanout list 80. Fanout list 80 includes a pair of outputs, one of which connects on data path 81 to provide input delay information to delay bus 53. The other output provides fanout gate number, pin number, and module number information on data path 136 to event bus 50.

Scheduled event table 85 additionally receives state/strength input information on data path 86, and receives time information from time bus 52 via data path 87. Scheduled event table 85 also provides module, gate and pin output information via data path 88 to the event bus 50, and communicates to and from fault pointer bus 100 via data path 89.

In operation, the system of FIG. 2 can perform logic simulation generally as follows. Control block 65 communicates with the various components to control the simulation process. Bus interface 42 receives and transmits data on the simulation bus 30, and also communicates to the other buses and components within the system. Input pin/output state evaluation block 60 updates the current input states of the gate or gates being simulated at a given event sample time, and produces a new output state from a truth table stored therein according to the type of logic gate. Scheduled, current output/delay 70 updates the current output state for the gate supplied by state/strength bus 51, and also handles rise/fall data for delay-type gates. Block 70 also provides a fanout pointer to the fanout list block 80 for the particular gate number's net list. Fanout list 80 fans out the new state to all gates that are connected to the current gate being simulated via connection to event bus 50. Scheduled event table 85 keeps track of all delayed outputs and inputs to ensure that the corresponding delayed output is fanned out to the proper gates at the proper time in a subsequent event simulation. As in normal logic simulation, events are simulated in time samples successively throughout the design based on the logic design data information stored therein.

In addition to the logic simulation function outlined above, and concurrently therewith, the present invention provides for multiple concurrent fault simulation. For this purpose fault processing pipeline 110 is provided in FIG. 2. Block 110 communicates over data path 111 to provide fault pointer information to the fault pointer bus 100. Block 110 receives inputs from several sources, including fault pointer information on path 112 from fault pointer bus 100, latest event time information from timed event table 85 on data path 113, and current time information from time bus 52 on data path 114.

Fault processing pipeline 110 also receives current input state information via data path 121 from pin/state update block 60, and current, scheduled and new output state information from state/strength bus 51 via data path 124. Data path 123 provides fault output states to state/strength bus 51, and fault input pin states to block 60 via data path 122 in order to use the truth table of three input Boolean functions contained there. The resulting fault output state of the truth table returns to block 110 via data path 51 for fault processing (i.e., comparison with "good" gate states).

Fault procesing pipeline 110 receives gate and fault number information from event bus 50 on data path 131. It also provides an output on data path 133 to pointer bus 100 and receives link or gate pointer information from fault pointer bus 100 on data path 135.

Generally, fault processing pipeline 110 and associated components function in conjunction with the other components to provide the concurrent fault simulation capability. Block 110 contains fault list memories to hold the fault numbers and fault states for each of the injected gate input pin or output pin faults which are to be run in the simulation. This information would include, for example, the identification of the gate and input or output thereof, and whether the fault effect was to have the pin stuck at a logical one or zero. This information is initially assigned and assembled in the host processor 12, based on the extent of fault simulation to be performed, and for a complete fault analysis, would include all possible faults for all inputs and outputs of all gates. This fault list information is sent to the control module 20 (FIG. 1), then loaded through the bus interface into block 110. Block 110 then holds the states information for the input and output pins of all gates exhibiting differences with their "good" counterparts for each fault number, and is selectively updated depending upon the results of the simulation of each fault number for each gate in the fault list memory, as the evaluation proceeds. Block 110 also holds in memory scheduled fault states and time information for subsequent fault simulations scheduled for a later time slice in the scheduled event table 85. Block 110 in effect operates to manage a fault effects list which is updated as the "good" logic network is being simulated and all faults on all corresponding gates are being simulated. The fault effects are determined by using the same hardware that the "good" logic network uses for its simulation. Thus, as normal logic evaluation proceeds, as a "good" gate is calculated and simulated by block 60, the corresponding fault numbers for that gate are similarly processed through, and the corresponding output states which are developed are compared against the good output for that gate, and if different, the fault outputs are updated and stored.

For any simulation that is executed, the states information for inputs is retrieved from memory, the output solution for the gate is determined from the truth table, and the output is stored and fanned out to other affected gates. In addition, for every fault that is "found" on that gate, the fault states and outputs are determined and records updated in memory if different from the good logic network solution. The fault effects caused by the simulation events are also fanned out to subsequent gates by good simulation control 65 and fanout list 80. In the case of fault effects due to appear at a later time slice, a scheduled fault output state is scheduled into the scheduled event table 85 separate from the good output states scheduled there.

According to one feature of the invention, the fault memory in block 110 is designed for flexible allocation because for different simulation jobs and at different points in a simulation the amount of fault data can vary widely. Thus, in order to have the memory logically expandable and contractable in accordance with the number of fault effects for a given gate, the memory is designed to be able to access all faults for a particular gate quickly and efficiently; to be able to put a used fault location in memory back to an unused status if the fault effect has been deactivated by a simulation event, and to provide pointer information identifying the next unused memory location for storaging a fault at any time.

According to the preferred embodiment of the invention, the fault memories are organized in a pipeline structure to utilize greater speed in fault processing. In this pipeline the "good" logic network is solved by simulating the model according to the events on the input, and determining if there are events generated on the output which need to be fanned out to other gate models, thereby generating more events to be simulated in the other models.

The fault processing pipeline is used to solve the "fault" network event(s) for the same gate model as the "good" network is being solved. Each time an event occurs on the "good" logic network gate model, if a list of faults exist for that gate model, the "fault" network must be evaluated to determine if the "fault" network is different from the "good" network.

If the "fault" network simulation proves to be different there exists a "fault effect" which is considered an event generated for the "fault" network. These fault events must be fanned out to the other gate models just as the "good" network events are fanned out. If the "fault" network simulation proves not to be different from the "good" network there is no fault effect event to be fanned out.

Figure 3A:
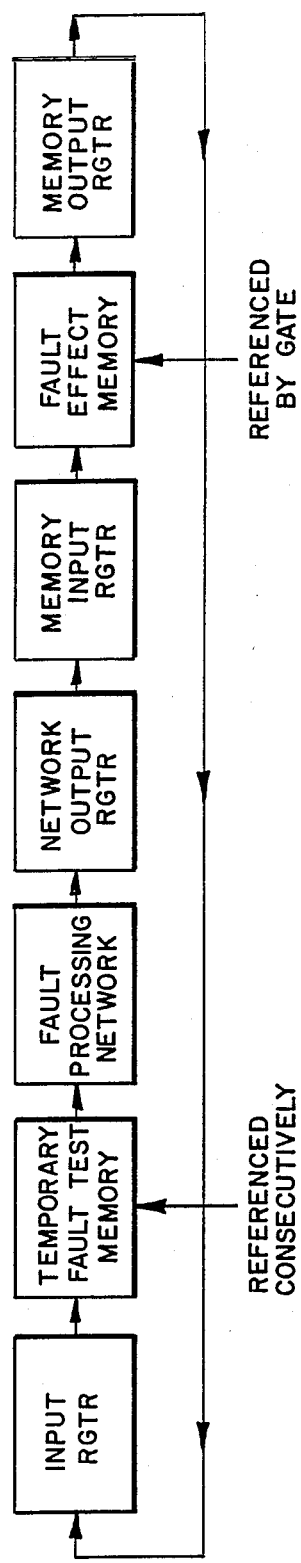
FIGS. 3A and 3B are block diagrams illustrating the fault processing pipeline operation according to the invention.
Figure 3B:
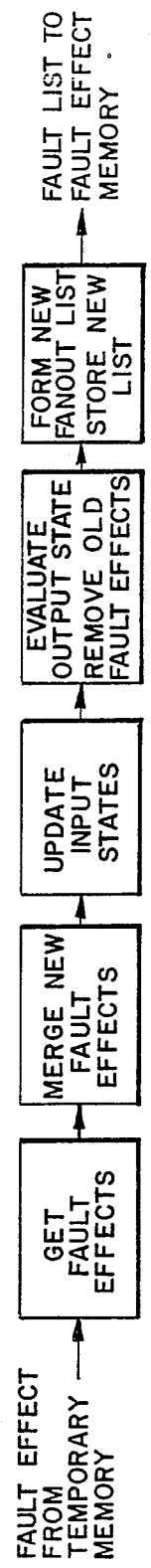

The hardware fault processing pipeline concept is illustrated in FIGS. 3A and 3B. The pipeline is designed to maintain current fault effect lists for gates as an event occurs for that gate.

The fault effects memory holds the fault list for a given gate. When there is an event for that gate, the process of updating the fault list begins. All the faults for that gate are retrieved and placed in the temporary fault list memory. Once the fault list is in the temporary memory, the faults are processed consecutively in the fault processing network which is shown in greater detail in FIG. 3B. The updated fault list is then prepared for fanout and placed back in the fault effects memory.

FIG. 3B shows the fault processing network. The functions performed in this network use the hardware of the fault processing pipeline and the good logic network truth table.

From the list of faults in the temporary fault list memory a fault effect is obtained. If this is a new fault it is then merged into the existing fault list. The input state of the "fault" network is then updated, if necessary. The output state of the "fault" network must then be evaluated by using the "good" network's truth table to obtain a "fault" network output state. If the "good" network output state and the "fault" network output state are alike, the fault effect is removed from the list. If the two are different a new fanout list is formed and stored.

By segmenting the fault processing network into specific hardware functions the fault list can be processed faster. As a fault is retrieved from the list and leaves the merge new fault segment, the next fault in the list is retrieved and started in the same segment. At any point in time there would be several faults in various stages of process through the pipeline, according to the function of the particular segment.

DETAILED DESCRIPTION OF FAULT PROCESSING

The detailed configuration and operation of one fault processing module and particularly of fault processing pipeline 110 of FIG. 2 is illustrated in greater detail in FIGS. 4A—4E and in the following description thereof.

FAULT LIST MEMORY

Figure 4A:
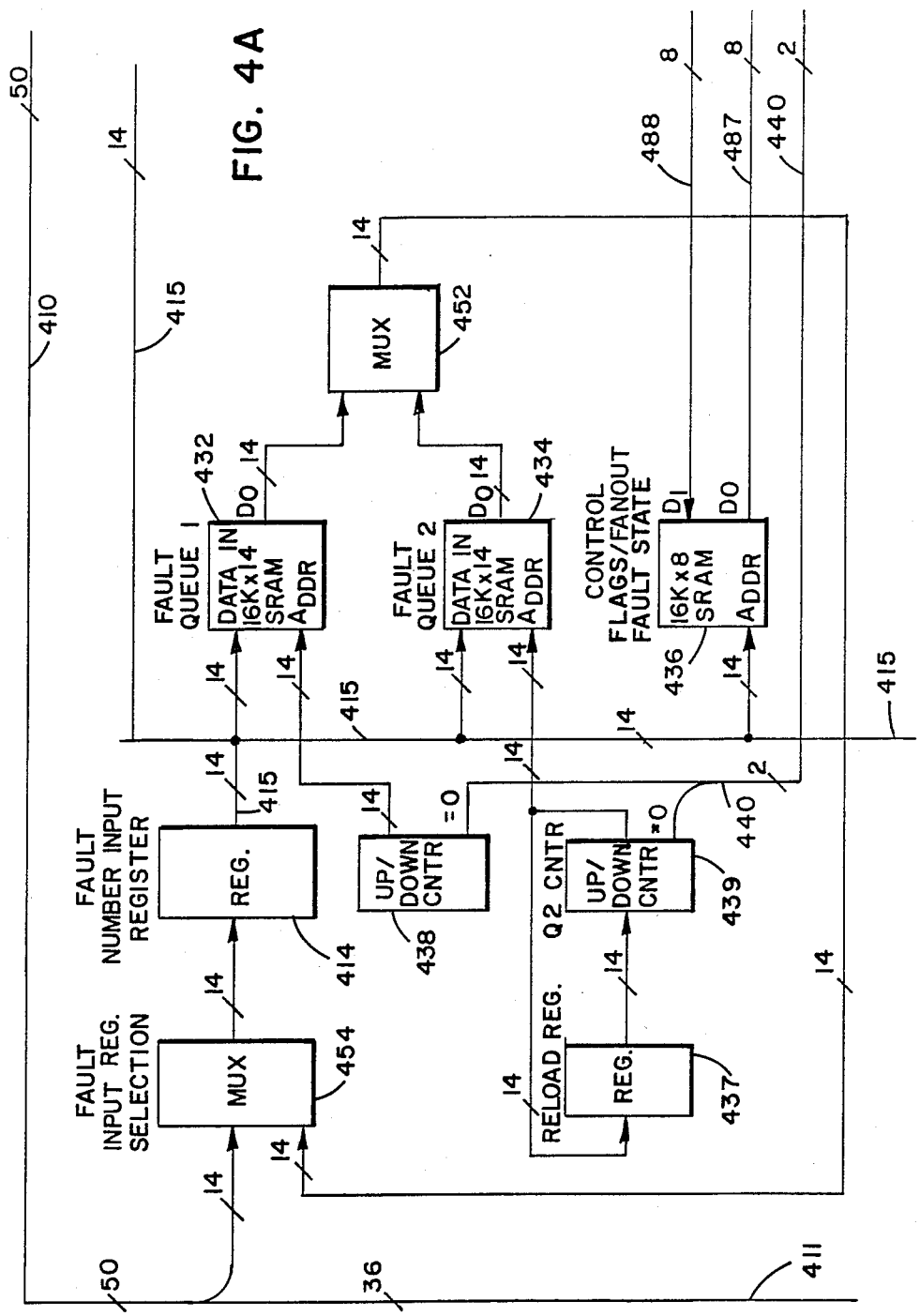
FIGS. 4A, 4B, 4C, 4D and 4E are a block diagram showing in greater detail the configuration of the fault processing hardware of the system of FIG. 2.
Figure 4B:
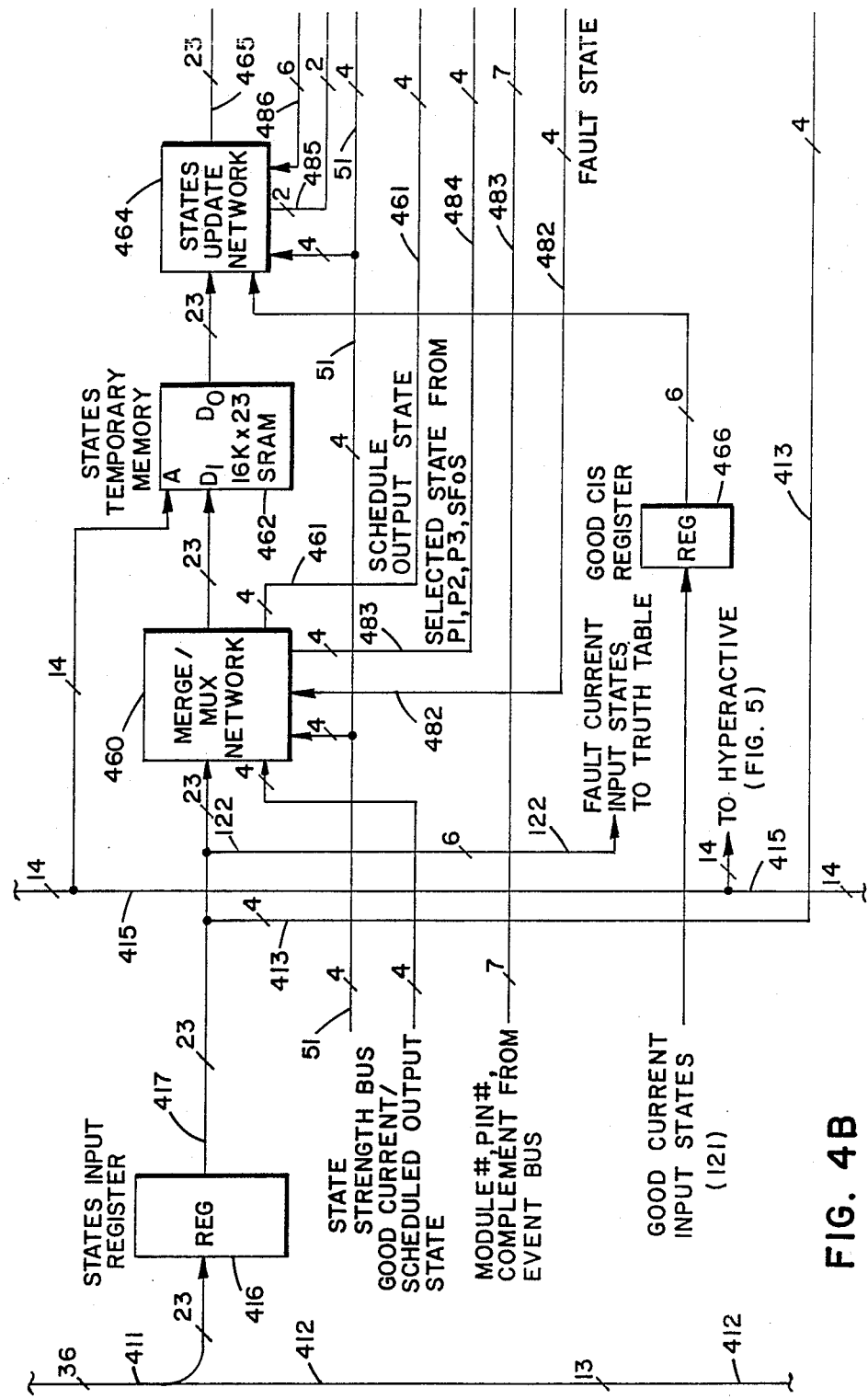
Figure 4C:
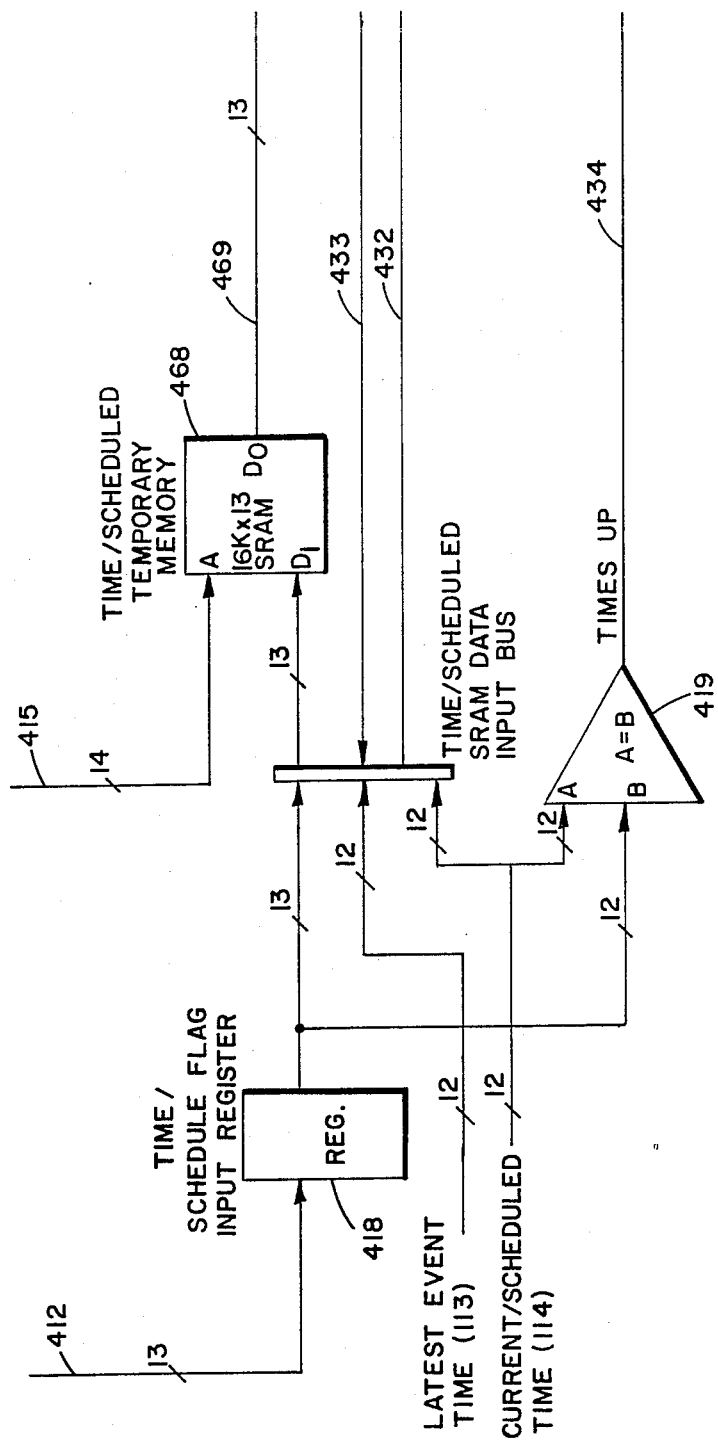
Figure 4D:
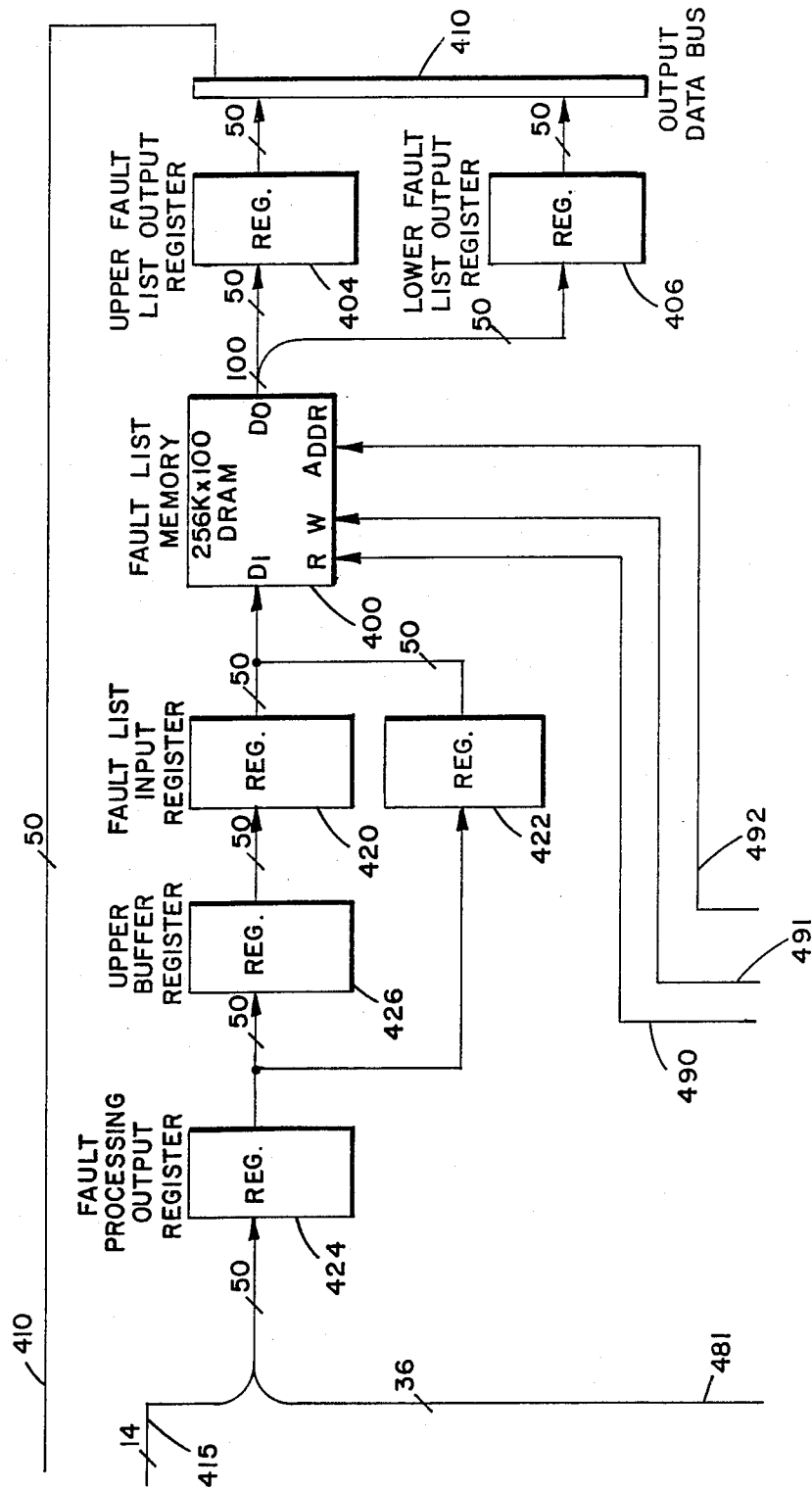
Figure 4E:
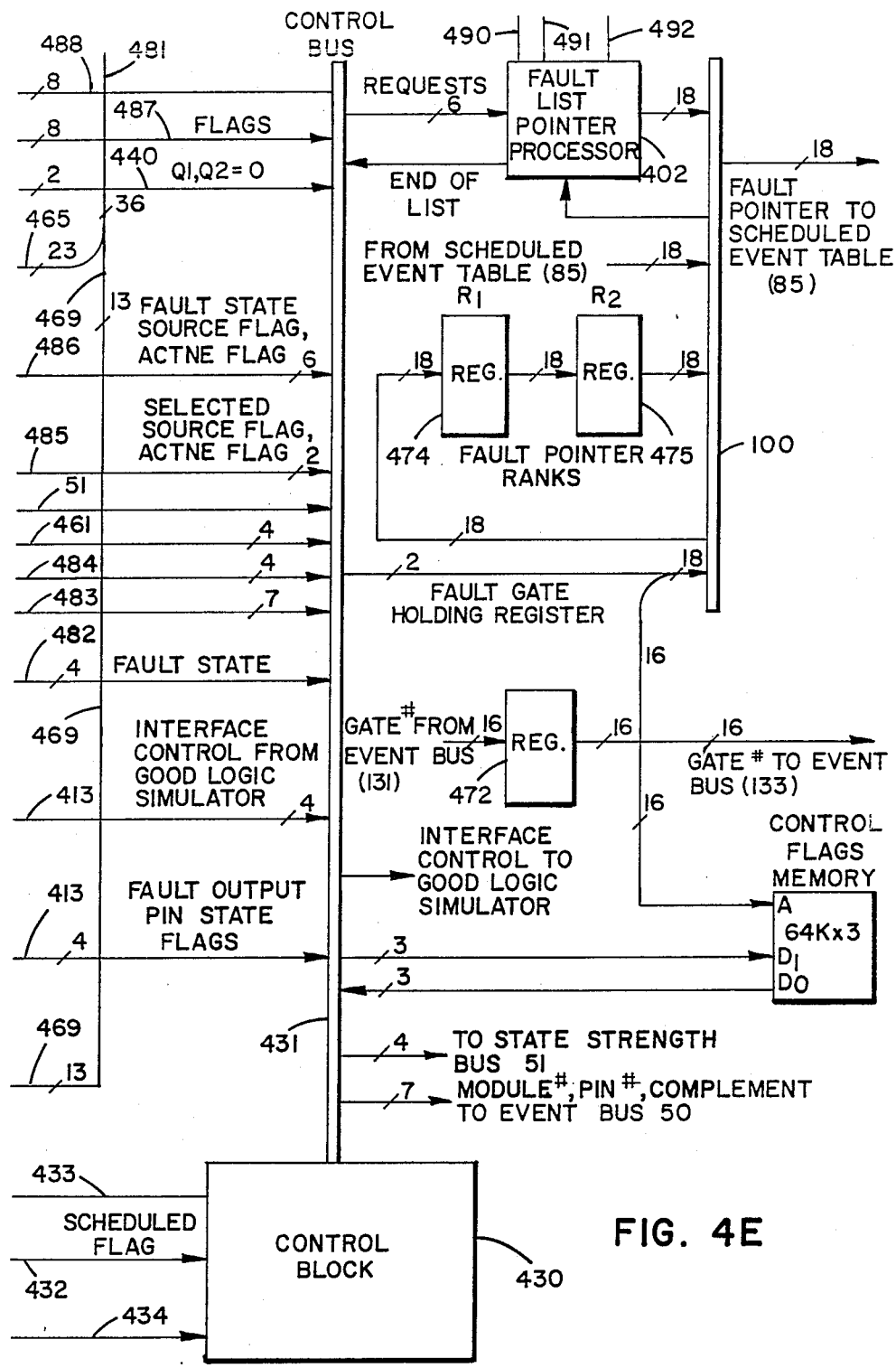

The fault list memory is indicated by reference number 400 in FIG. 4D. The basic entry in this memory is 50 bits with two 50-bit entries per memory word. Thus, 500K fault effects is the maximum number of faults that can be handled in the embodiment of the invention shown. The fault pointer processor 402 reads up one word into the upper and lower output registers 404 and 406 respectively, which are enabled one at a time and transmitted via output data bus 410 to input registers 414, 416 and 418 for fault number, states, and time and schedule flag, respectively. During fault processing, the fault list memory is written back from the fault list input registers 420, 422 once two 50-bit entries are assembled. The fault processing output and upper buffer registers 424, 426 act as a second rank to buffer and hold fault list memory data for the next write.

Once a fault from fault list memory 400 is enabled to the output data bus 410 it is broken down into its respective parts for fault processing. A 14-bit fault number is selected into the fault number input register 414. The 14-bit fault number used in the preferred embodiment allows for a maximum of 16K faults to be injected and evaluated concurrently with the good simulation. The states input register 416 receives 23 bits of information as follows: two state bits for each of the three input pins of the modeling elements or gates; two flags for each of the three input pins, one called a source flag representing a stuck-at fault, and an active flag to note whether that pin state is currently different from the good pin state; six bits for the 4-bit output state/strength along with a source flag and active flag; four additional bits representing the scheduled fault output state/strength (SFOS) for fault effects caused by modeling elements with rise/fall delays; and, finally, an evaluation flag used for edge-triggered modeling elements such as flip-flops. Register 416 suplies the above information via data path 417 to block 460.

The time/schedule input register 418 receives 12 bits of time information which is used to mark the sample time that the scheduled fault output state is to be different from the good output state. The scheduled flag identifies the time and scheduled fault output state fields as valid data for a particular fault number. The times up comparator 419 is used by the control block 430 to process the scheduled fault effects at the expired sample time.

Fault Queue 1 and 2 Structure

As the fault list is read from the fault list memory 400 for fault processing, the 14-bit fault number may be written into fault queue 1 (reference number 432), fault queue 2 (434) or both. Fault queue 1 normally contains all fault effects currently associated with the gate being processed, and fault queue 2 contains the fault numbers for all new fault effects which will be added to, changed or deactivated from gates in the current gates' net list. The control flags memory 436 includes flags indicating whether a fault number is in queue 1 or queue 2, the fanout fault state to be passed on to gates in the fanout net list, a source fault flag used for injecting the stuck-at faults, and a drop flag to delete faults from all fault lists which have been found at the observation test points of the network. Queue 1 and queue 2 up/down counters 438, 439 address and control the loading/unloading of fault queues, and zero status is passed via data path 440 to control bus 431 to tell the control block when they are empty for noting completion of fault processing. The queue 2 reload register 437 puts the total queue 2 count back so that the fanout fault list may be restored for processing each gate in the fanout net list.

The output data of fault queues 1 and 2 is selected by multiplexer (mux) 452 and mux 454 to ensure that all active fault numbers are stored back into the fault list memory via the fault number input register to fault output register data path.

States Data Paths

As mentioned above, state data is read out of the fault list memory 400 and is placed into the states input register 416. When the fault processing calls for truth table evaluation, six bits representing the combination of good and fault states on the three input pins of the modeling element being processed are sent directly from the output data bus 410 to the truth table, block 60 (FIG. 2) via data path 122. The fault output state returns via the state and strength bus 51 to both the states logic blocks 460, 464 and the control block 430. This state may be placed in the SFOS field in the state's temporary memory 462, or may be used in the update network 464, or in the control block 430. As fault list data is read from the fault list memory, it passes through the merge/mux network 460 and is written into the state's temporary memory 462. The fault number for each entry in the fault list addresses READs or WRITEs ino or out of the states, and time/scheduled temporary memories 462 and 468, respectively, via a branch of addressing path 415. The merge/mux network 460 supplies fault states selected data path 417 to the control block 430 for use in fault updating. Block 460 also suplies a scheduled output state on path 461 which may be selected from the SFOS portion of data bus 417 or the good current output state (COS) or scheduled output state (SOS) via data path 124. Block 462 accumulates all the pertinent good or fault states for each fault number as it is read out of the fault list memory 400. The states update network 464 is used to turn the source flag and/or active flag on or off for pins 1, 2, 3, and the output pin (pin 0) of the gate being simulated. Network 464 also keeps the good states on all pins not faulty with the current good logic simulation states, and updates the fault state for each event being processed. The states update network 464 receives a copy of the current good input states from the good current input states (CIS) register 466. Block 466 latches the good states at the start of fault processing. The states update network 464 interfaces with the control block 430 to provide the current source flags and active flags for the particular gate pin number being processed. The control block in turn supplies the new values for the flags along with the new fault state for insertion in the proper state field before the data is sent back to the fault list memory 400 via the output register 424.

Control Block

The control block 430 performs the compare functions between the good and fault states for all possible delay and zero delay simulation events. Good simulation is monitored via the interface control from the good logic simulation hardware described above with reference to FIG. 2 in order to determine when the good logic simulation event should be halted so that the fault evaluation can be performed. Interface control to the good logic simulator is used to halt the good simulation and otherwise use the good simulator to process events caused solely by fault effects such as delayed fault events to the scheduled event table 85 (FIG. 2) or fanout of fault events which are not part of the good simulation. This control interface also ensures that the fault events do not change the concurrent good simulation. The control bus 431 takes in the good module number, pin number and complement bit and holds them until fault processing is done. They are then released back to the event bus 50 for continuation of the good simulation. This path is also used to place additional events caused by fault effects into the good simulator to produce further possible fault effects. Likewise, the state and strength bus 51 brings in the various new current or scheduled good states to be used for comparison, or the fault output state from the truth table stored in block 60, FIG. 2. In turn, the control block 430 returns the good or fault states to the state/strength bus 51 when it allows the good simulation to continue. The control block also interfaces to the fault list pointer processor 402 in order to access the fault list. An end of list signal is returned to the control block to determine when the READ memory operation is finished.

Pointer Processor

The pointer processor 402 translates various requests from the control block 430 into the READ, WRITE, and addressing signals needed to exercise the DRAM (dynamic random access memory) fault list memory 400. Access may include READ, DESTRUCTIVE READ, WRITE, or POINTER FETCH operations. The pointer processor keeps track of used and free space in the fault list memory so that it can create lists of fault effects for each gate as necessary and add to or delete from those lists according to the dynamic changes in fault effects as the good simulation proceeds. Fault lists are commonly addressed by gate number via the fault gate number holding register 472 through the fault pointer bus 100. The pointer processor 402 translates this gate number into a pointer to address the fault list for that particular gate. Also, a list of fault effects associated with a delay may be accessed directly with a fault pointer address stored to or read from the scheduled event table 85 via data path 89 (FIG. 2).

The pointer to this list is fetched from the pointer processor 402 and stored in the scheduled event table 85 until the delay has expired. It is then sent to the fault pointer ranks R1 and R2 (474, 475) and from R2 it is sent back into processor 402 to read the fault list directly. Fault pointer ranks 1 and 2 allow one operation to be started while the next READ of the scheduled event table 85 is performed. This synchronizes the fault processing with the pipeline processing of the good simulation hardware.

Fault Gate Holding Register

The fault gate holding register 472 captures and holds the gate number associated with the simulation event to be fault processed. It is used to create, read, or write a fault list via the fault list processor 402 and alo addresses a control flags memory 478. The gate number control flags are used to mark the existence of fault list to the control block 430, and flag special handling for fanout gates having input delays (connection delay). Reading and writing of these flags is performed by the control block 430.

Hyperactive Fault Hardware

According to another feature of the invention, means are provided for solving special problems inherent in concurrent fault simulation, namely:

(1) faults which have a much higher than normal activity rate because they generate oscillation loops or have high connectivity (such as clocks or static control lines) and therefore use up large amounts of fault list memory because the fault effects propagate throughout the network; and (2) faults which cause oscillation loops of zero delay such that the sample time does not advance. These faults must be detected and dropped so that the run may continue. They also may be indicative of incorrect network modeling.

The first category may be termed "hyperactive faults" and are typically a small percentage of the total fault set. If they are not detected until late in the run, processing time will be much slower and performance will suffer. By detecting and dropping these faults early, the processing efficiency will be significantly improved with minimal effect on the total fault coverage results.

The second category is particularly hazardous since these faults would cause the simulation run to never finish. The hardware must detect and report these faults so that they may be dropped and allow the sample time to advance.

In addition, the user may simply want to detect all faults that cause non-zero delay oscillations (i.e., the fault effects do not remain static at the specified strobe time) even though they may not be hyperactive.

Figure 5:
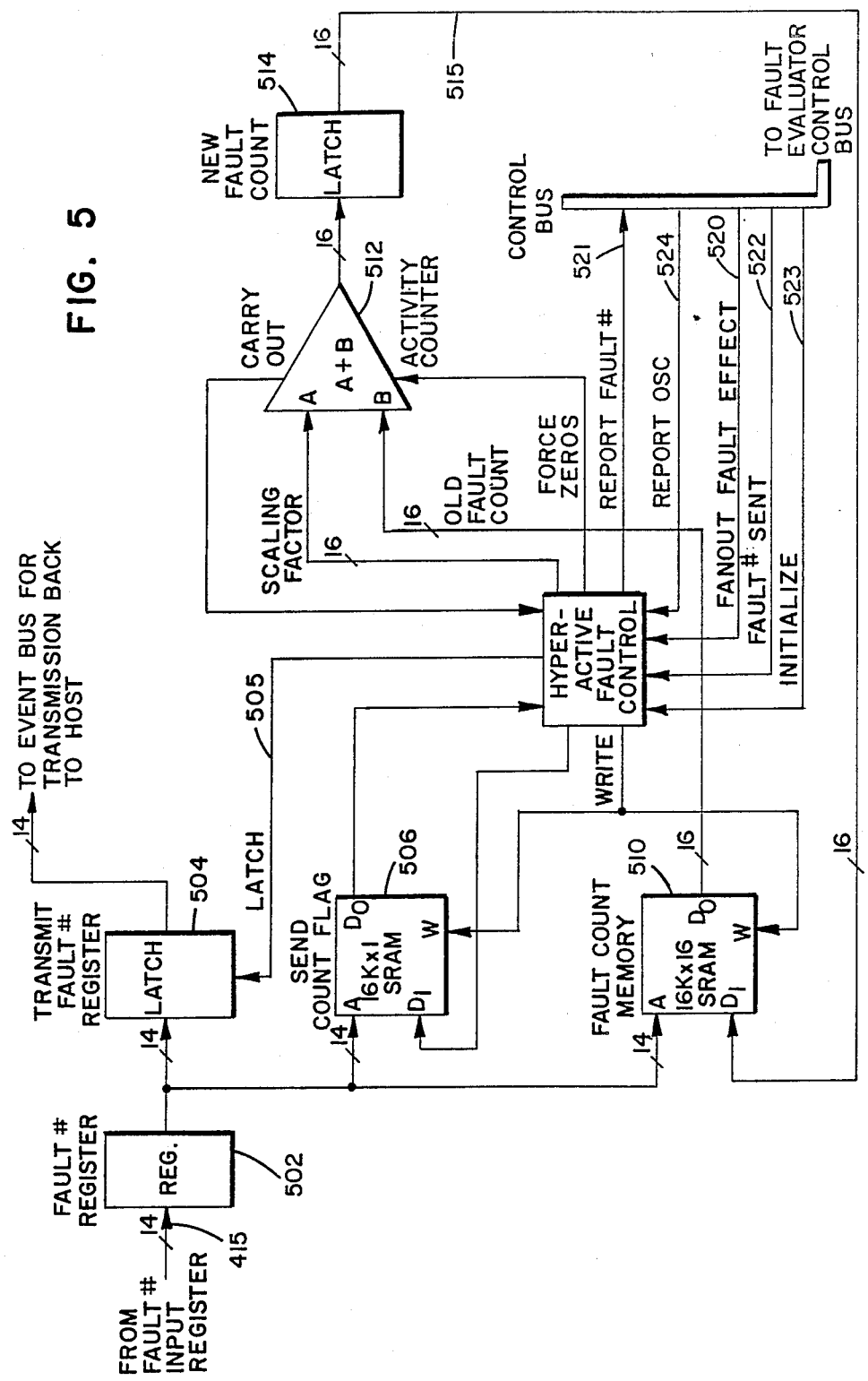
FIG. 5 is a block diagram of the hyperactive fault logic according to one feature of the present invention.

The hardware indicated in FIG. 5 provides means for reporting all oscillating faults at the specified strobe time. The fault number register 502 receives the fault number from the input register 414 of FIG. 4 via a branch of data path 415 as fanout fault effects are placed in queue 2. The fanout fault effect line 520 from the control bus 431 notes that the count for this fault number is to be read up from the fault count memory 510 and added to the scaling factor at block 512. If the counter generates a carry-out it has exceeded the maximum count and will latch the fault number in the transmit fault number register 504 and at the same time send a report fault signal back on line 521 to the control bus 431. The control block 430 (FIG. 4) enables the fault number to the event bus 50 at the proper time for transmission to the control module 20 (FIG. 1) via S-bus 30 and then to the host 12 via the input/output port. The "fault number sent" line 522 from the control block unlatches the transmit fault number register 504 via control line 505.

As each fault number is placed in queue 2, its old count is read up from the fault count memory 510, added to the scaling factor, and the new count is written back into the memory via 514, 515. If a fault number is already latched in 504 and the maximum count is exceeded on successive fault numbers, the send count flag is set and stored in the send count flag SRAM 506. When this fault number appears the next time at the fault number register 502, the send count flag is read up and causes that fault number to be latched and transmitted. The flag is then cleared for that fault number. The send flag is a means of reporting all fault numbers that attain the maximum count without interrupting the queue 2 processing rate.

The scaling factor may be programmed high or low so that enough fault count markers are sent to provide a sufficient data base for statistical calculations. Fault numbers with activity counts higher than average may be detected by the control module and dropped before they impair performance.

The INITIALIZE line 523 is used to put all fault counts to zero before the run starts.

The REPORT OSC line 524 from the control bus is used for zero and non-zero delay oscillation detection. This line forces a carry-out for all fault numbers noted as fanout fault effects. At a specified strobe time, if non-zero oscillation detection is desired, the control module 20 causes this line to be set and extends the simulation for enough sample times to report all fault numbers still active (i.e., having fanout fault effects). The control module 20 will then inject the next test vector and continue the fault simulation. Alternately, if the sample time does not advance after a predetermined wall clock period, a zero delay oscillation fault effect exists and again, the same mechanism is used to report the fault(s).

Figure 6B:
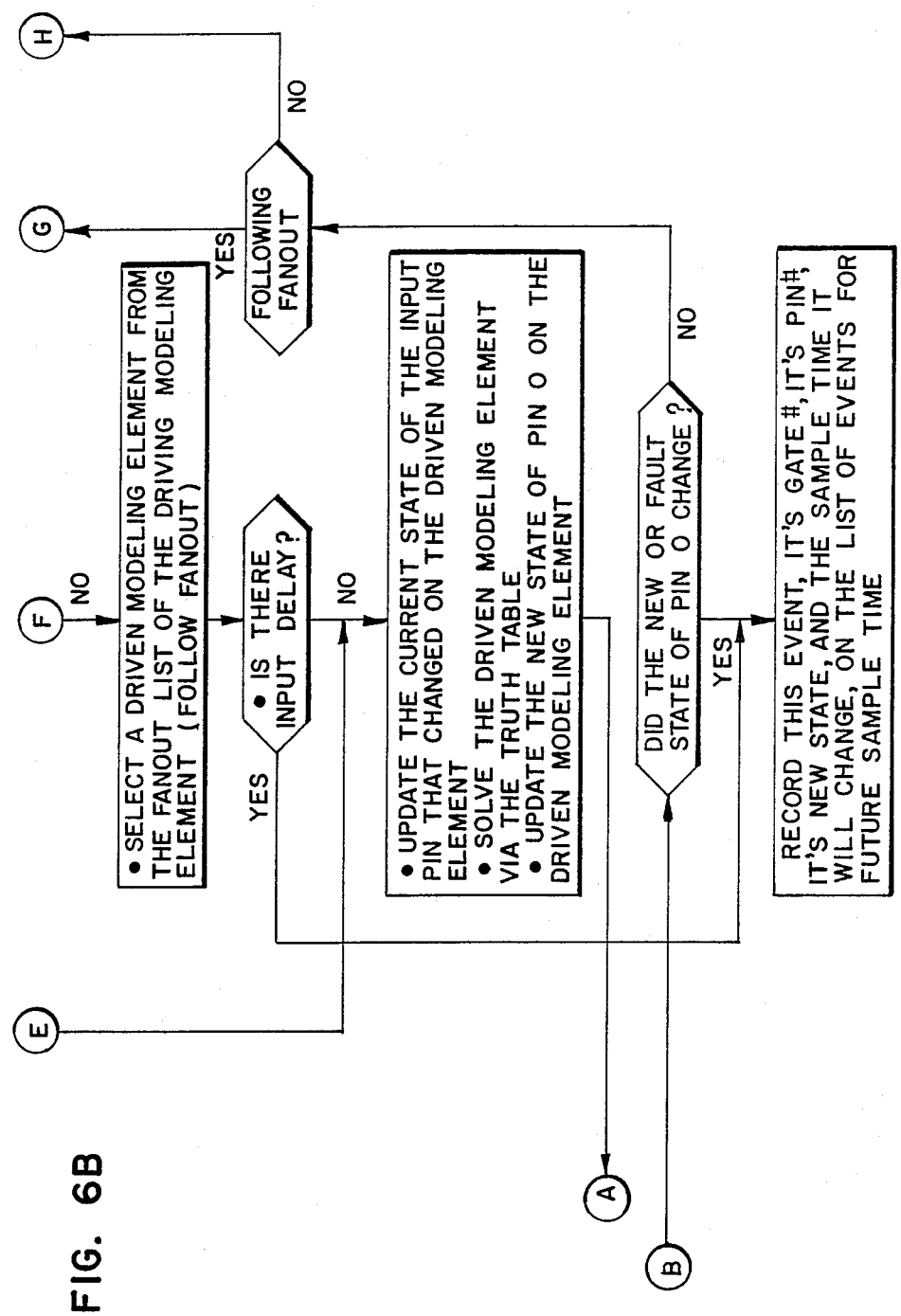
Figure 6C:
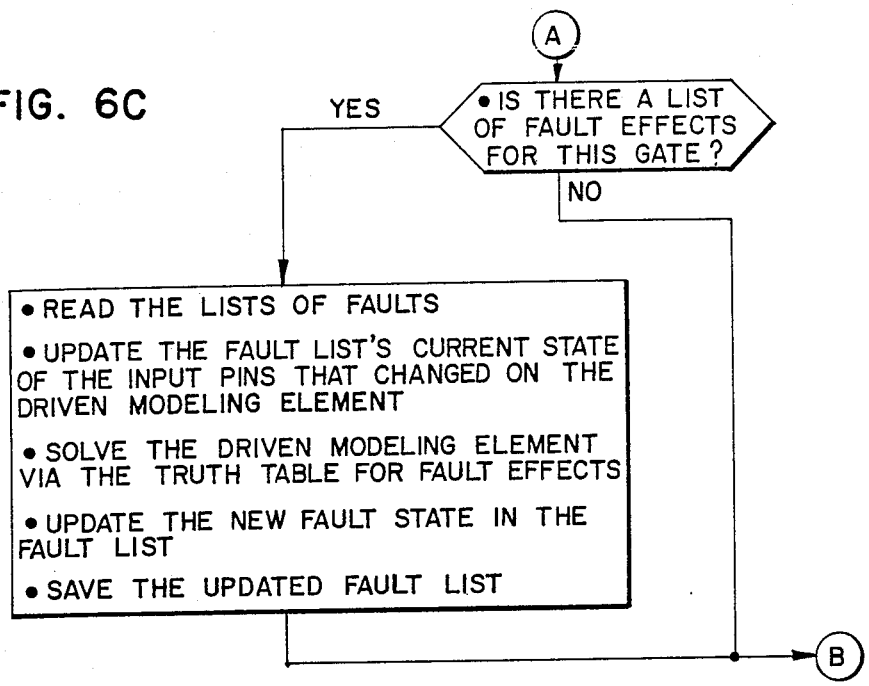
Figure 6C:
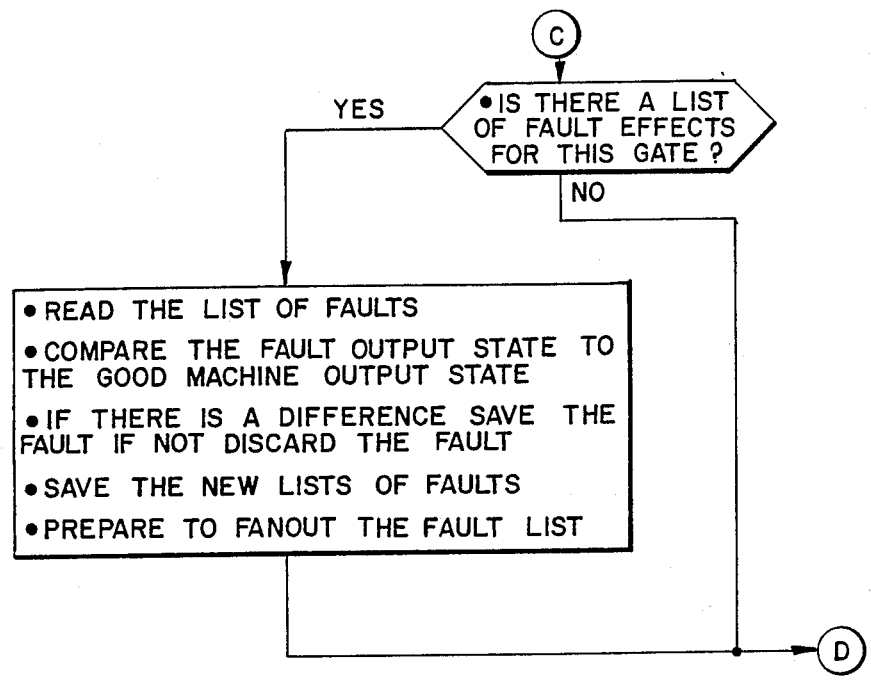

The operation of the fault simulation hardware described above is further summarized in the flowcharts of FIGS. 6A, 6B, 6C. In this flowchart, the various operations are indicated by the legends at the various steps, and the sequence is indicated by the flow arrows. The steps in FIG. 6 are self-explanatory, and in each case refer to detailed operations previously described in the foregoing description with respect to FIG. 1-5.

In summary, the present invention provides improved efficiencies in logic simulation and evaluation by providing concurrent fault evaluation along with logic design evaluation to thereby allow development of an effective input test set for production testing of logic devices to be manufactured according to the design. This fault evaluation is performed with greater speed and efficiency than previous techniques.

What is claimed is:

1. Concurrent fault simulation apparatus, comprising:
a logic simulation network including first memory means for receiving and holding information describing a logic design to be simulated including the logic function and interconnections for all elements of said logic design, second memory means for holding the present state of each element, means operatively connected to said first memory means and said second memory means for processing on a time-slice basis to simulate the good operation of and to update the present state of each input element and to proceed to simulate all other elements interconnected thereto to verify the operation of the logic design;
third memory means for holding a list of specific faults to be simulated which are associated with individual elements of the logic design;
means operatively connected and responsive to the fault list memory contained in said third means and to said logic simulation network for concurrently simulating the fault operation for such elements corresponding to each fault associated therewith;
means for comparing the fault operations and good operation of each such element; and
means for storing data identifying each fault and fault operation if it differs from the good operation of the element.

2. Concurrent fault simulation apparatus according to claim 1, further including means for counting the activity of a particular fault being simulated in terms of the number of additional elements interconnected with and affected by the fault operation of a particular element being simulated, and means responsive to a predetermined count for signalling hyperactivity status of the particular fault and for avoiding further simulation of faults associated with the hyperactive fault.

3. Concurrent fault simulation apparatus according to claim 1, further including means for monitoring the number of fault effects still active after a predetermined number of time-slice sample times from a particular time-slice sample time, and means responsive to said predetermined number for identifying faults still active as oscillating faults.

4. Concurrent fault simulation apparatus according to claim 3, further including means for eliminating oscillating faults from further processing.

5. Concurrent fault simulation apparatus according to claim 3 wherein said means for monitoring comprises means for monitoring the number of fanout fault effects.

6. Concurrent fault simulation apparatus according to claim 1, further including means for monitoring real time lapse during fault processing for a particular time-slice sample time to identify faults causing zero-delay oscillations by identifying the fault number of the fault remaining active at the end of said time lapse, and means for eliminating the identified zero-delay oscillating fault to continue the fault processing.

7. Concurrent fault simulation apparatus, comprising:
a logic simulation network including first memory means for receiving and holding information describing a logic design to be simulated including the logic function and interconnections for all elements of said logic design, second memory means for holding the present state of each element, means operatively connected to said first memory means and said second memory means for processing on a time-slice basis to simulate the good operation of and to update the present state of each input element and to proceed to simulate all other elements interconnected thereto to verify the operation of the logic design;
a fault effects processing pipeline oepratively connected to said logic simulation network, said pipeline including a fault effects memory means for holding a list of specific faults to be simulated which are associated with individual elements of the logic design;
said pipeline including temporary fault list means for retrieving and temporarily storing all faults associated with a selected element of the logic design to be simulated;
said pipeline including means responsive to said temporary fault list means and operable in conjunction with said logic simulation network for concurrently simulating the fault operation for each particular fault for each particular element;
said pipeline including comparison means for comparing the fault operation and good operation of each particular element for each particular fault;
said pipeline including means operatively connected to said comparison means for removing a fault effect from said fault effects memory means in the event that a simulated output for a good operation and fault operation of a particular element of the logic design are the same; and
said pipeline including means operatively connected to said comparison means and responsive to a difference between the good and fault operations of a particular element of the logic design for a particular fault to create and store fault effects as new faults associated with all other gates interconnected with and affected by said particular fault into said fault effects memory means.

8. Concurrent fault simulation apparatus according to claim 7 wherein the individual components of said pipeline are adapted for independent operation so that a plurality of faults may be in different stages of processing simultaneously in said pipeline.

9. Concurrent fault simulation apparatus according to claim 7, further including means for counting the activity of a particular fault being simulated in terms of the number of additional elements interconnected with and affected by the fault operation of a particular element being simulated, and means responsive to a predetermined count for signalling hyperactivity status of the particular fault and for avoiding further simulation of faults associated with the hyperactive fault.

10. Concurrent fault simulation apparatus according to claim 7, further including means for monitoring the number of fault effects still active after a predetermined number of time-slice sample times from a particular time-slice sample time, and means responsive to said predetermined number for identifying faults still active as oscillating faults.

11. Concurrent fault simulation apparatus according to claim 10, further including means for eliminating oscillating faults from further processing.

12. Concurrent fault simulation apparatus according to claim 10 wherein said means for monitoring comprises means for monitoring the number of fanout fault effects.

13. Concurrent fault simulation apparatus according to claim 7, further including means for monitoring real time lapse during fault processing for a particular time-slice sample time to identify faults causing zero-delay oscillations by identifying the fault number of the fault remaining active at the end of said time lapse, and means for eliminating the identified zero-delay oscillating fault to continue the fault processing.

* * * * *